(12) United States Patent
Morris

(10) Patent No.: US 7,196,459 B2
(45) Date of Patent: Mar. 27, 2007

(54) LIGHT EMITTING ASSEMBLY WITH HEAT DISSIPATING SUPPORT

(75) Inventor: Thomas M. Morris, Corpus Christi, TX (US)

(73) Assignee: International Resistive Co. of Texas, L.P., Corpus Christi, TX (US)

( * ) Notice: Subject to any disclaimer, the term of this patent is extended or adjusted under 35 U.S.C. 154(b) by 0 days.

(21) Appl. No.: 10/728,671

(22) Filed: Dec. 5, 2003

(65) Prior Publication Data

US 2005/0122018 A1   Jun. 9, 2005

(51) Int. Cl.
*F21V 29/00* (2006.01)

(52) U.S. Cl. ........................................ 313/46; 362/294

(58) Field of Classification Search ............ 313/44–47, 313/512; 362/555, 249, 294, 373, 800, 512
See application file for complete search history.

(56) References Cited

U.S. PATENT DOCUMENTS

| | | | |
|---|---|---|---|
| 3,598,985 A * | 8/1971 | Harnden et al. ............... | 362/11 |
| 4,628,422 A | 12/1986 | Ewald | |
| 4,729,076 A | 3/1988 | Masami | |
| 4,742,432 A | 5/1988 | Thillays | |
| 4,935,665 A | 6/1990 | Murata | |
| 5,098,864 A * | 3/1992 | Mahulikar ................... | 29/837 |
| 5,528,474 A | 6/1996 | Roney | |
| 5,632,551 A | 5/1997 | Roney | |
| 5,782,555 A | 7/1998 | Hochstein | |
| 5,785,418 A * | 7/1998 | Hochstein .................... | 362/373 |
| 5,857,767 A * | 1/1999 | Hochstein .................... | 362/294 |
| 6,016,038 A | 1/2000 | Mueller | |
| 6,045,240 A * | 4/2000 | Hochstein .................... | 362/294 |
| 6,161,910 A | 12/2000 | Reisenauer | |
| 6,428,189 B1 * | 8/2002 | Hochstein .................... | 362/373 |
| 6,435,549 B1 | 8/2002 | Sanderson | |
| 6,480,389 B1 | 11/2002 | Shie | |
| 6,517,218 B2 * | 2/2003 | Hochstein .................... | 362/294 |
| 6,582,100 B1 * | 6/2003 | Hochstein et al. .......... | 362/294 |
| 6,614,103 B1 * | 9/2003 | Durocher et al. ............ | 257/678 |
| 6,670,751 B2 * | 12/2003 | Song et al. .................. | 313/512 |
| 6,999,318 B2 * | 2/2006 | Newby ........................ | 361/719 |

* cited by examiner

*Primary Examiner*—Karabi Guharay
*Assistant Examiner*—Dalei Dong
(74) *Attorney, Agent, or Firm*—G. Turner Moller

(57) ABSTRACT

A light emitting assembly includes a metal substrate for dissipating heat from the assembly. The metal substrate includes an electrically insulating layer or coating on at least one side. Circuit traces are applied to the electrically insulating layer using either thick or thin film techniques. At least the ends of the circuit traces include a metallic section to which leads of light emitting elements are soldered or wire-bonded. A metallic section is provided adjacent the light emitting element to transfer heat to the underlying substrate and/or to reflect light from the element away from the substrate. A clear finish retards tarnishing of the reflecting metallic section.

24 Claims, 2 Drawing Sheets

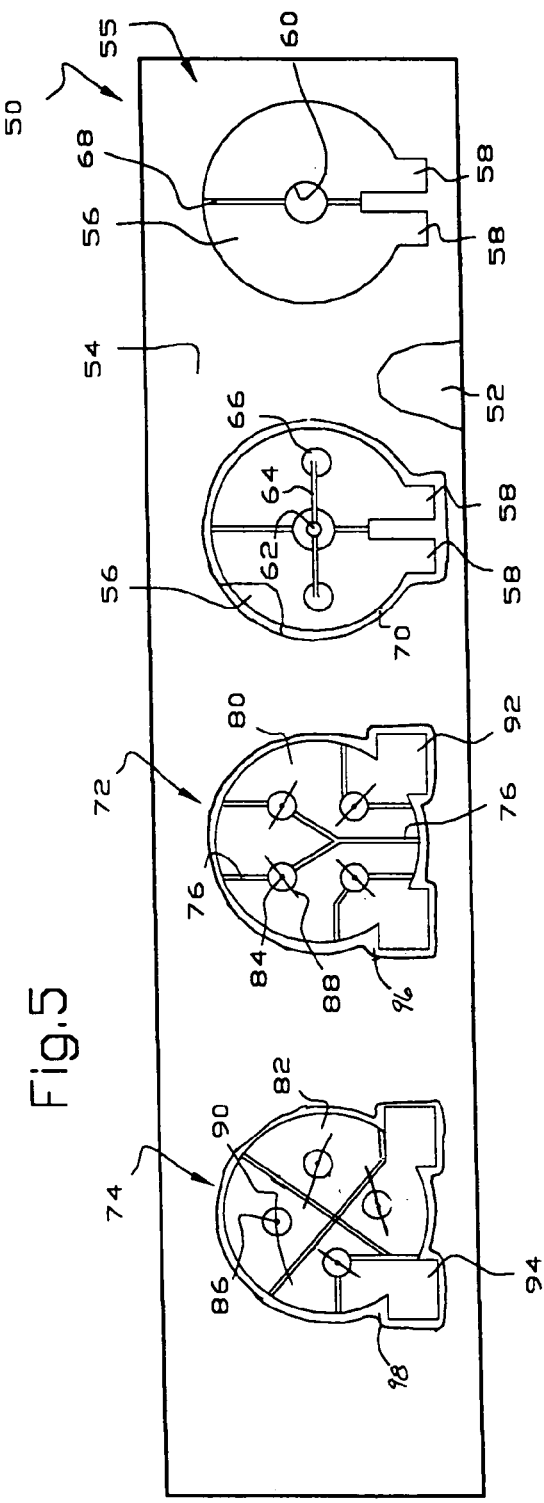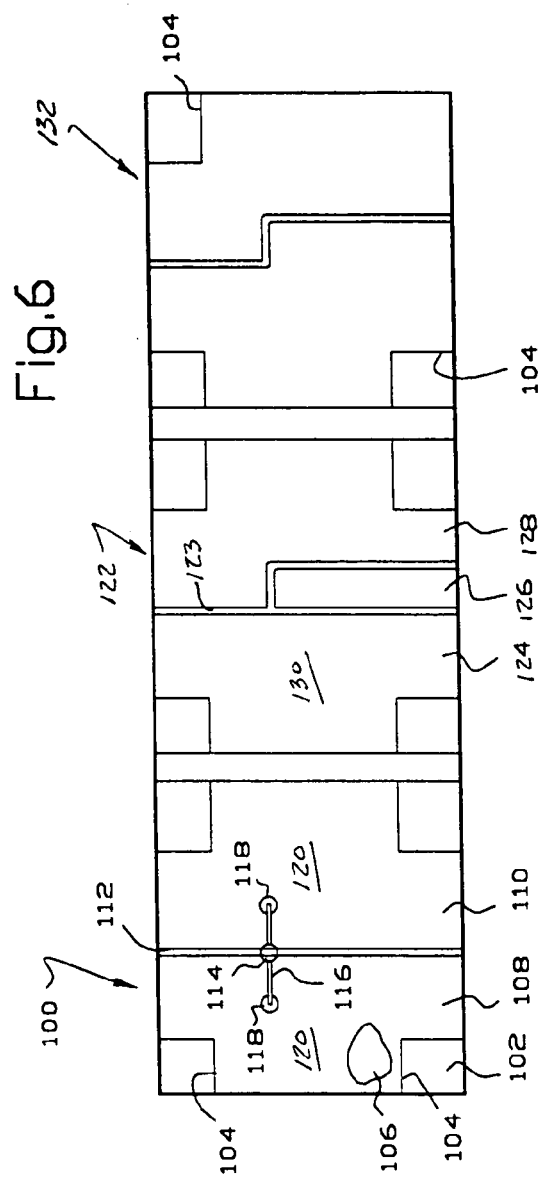

LIGHT EMITTING ASSEMBLY WITH HEAT DISSIPATING SUPPORT

This invention relates to an improved light emitting assembly having a heat dissipating support for reducing the operating temperature of the assembly.

BACKGROUND OF THE INVENTION

Light sources are evolving toward assemblies of light emitting elements such as light emitting diodes which are known in the art as LED's. Assemblies of LED's are being used or will be used in many high volume applications because they produce substantial light in proportion to the power consumed, are long lived and are extremely reliable. One such application is light sources for vehicles, such as headlights, taillights and directional signal lights. Other applications include replacements for florescent and incandescent lights and the like.

High output LED's, particularly when a large number are used on a common support, have a problem because they produce a significant amount of heat and the current generation of LED's begin to lose brightness when they are hotter than about 100° C. There are two current approaches to dissipate heat in commercially produced high output LED assemblies. The first is to apply the LED's to a circuit board which is glued to an aluminum heat sink. This is not a particular efficient technique for dissipating heat because the circuit board and the glue are tolerably good thermal insulators thereby insulating the heat source from the heat sink. The second is to apply the LED's to an epoxy layer bonded to an aluminum plate. The epoxy layer acts as an electrical insulator for electrical reasons but it is likewise a good thermal insulator thereby insulating the heat source from the heat sink.

It has been proposed in U.S. Pat. No. 5,857,767 to apply LED's to an aluminum heat sink which is anodized or which is coated with an electrically insulating layer by using a thermally conductive adhesive, i.e. an adhesive having dispersed metallic particles. There are several problems with this approach. First, conductive adhesives are inferior to solder in both electrical and thermal conductivity. Second, the electronics assembly process requires two steps, one to attach those components that are preferably soldered and one to attach those components which must be adhesively secured.

Disclosures of interest are found in U.S. Pat. Nos. 4,628,422; 4,729,076; 4,742,432; 4,935,665; 5,528,474; 5,632,551; 5,782,555; 5,785,418; 6,016,038; 6,045,240; 6,161,910; 6,435,459; 6,480,389; 6,517,218 and 6,582,100.

SUMMARY OF THE INVENTION

In this invention, a light emitting assembly includes a substrate or heat sink, a series of circuit traces on the substrate and one or more light emitting elements. The substrate or heat sink is a metal which is coated with a thin electrically insulating layer. Preferably, the metal is anodized to produce the electrically insulating layer. The metal may be of any suitable type but preferably is an anodizable type such as aluminum, magnesium and their alloys. The substrate is anodized in a conventional manner to produce a thin, tough electrically insulating coating bonded directly to the underlying metal. Anodized aluminum substrates have three powerful advantages: low cost, structural strength and high heat dissipating capacity. In some situations, the substrate is masked to provide sections with no anodized layer to provide a direct thermal path from the LED to the substrate. In addition, masked sections of the substrate may be used to reflect light from the LED's thereby increasing the amount of light emitting from the assembly and reducing the amount of energy absorbed by the substrate.

The circuit traces of the LED assemblies of this invention may be made either by thin or thick film techniques, depending on the application. Thin film techniques are more expensive but are capable of producing devices capable of operating at higher voltages because the electrically insulating layer is not degraded by the heat processes needed in the manufacture of thick film devices. In addition, thin film techniques allow for smaller line widths, known as finer geometries, which result in more components per unit area. As is known in the art, conventional thin film techniques apply circuit traces to the electrically insulated substrate by vapor deposition or sputtering of conductive materials onto the substrate.

Thick film techniques tend to produce low cost assemblies which have a feature size down to about 100 microns. As is known in the art, conventional thick film techniques apply circuit traces by applying inks to the electrically insulated substrate, typically by screen printing or direct writing techniques, and then curing the inks in an oven. Thus, circuit traces are applied by either thick or thin film techniques to the substrate to provide current paths between the LED's, the power supply and any other circuitry or components that may be necessary or desirable in the operation of the end product.

As will become apparent, an important feature of this invention is the use of silver or a silver based material to provide the circuit traces and to provide a shiny metallic patch beneath or adjacent the LED's. Silver based circuit traces can be soldered or wire-bonded with conventional techniques so all connections can be made in one process step. Because the silver patches are prone to tarnish in air, the silver patches are overprinted with a clear lacquer. Thus, the silver patches increase reflectivity of the substrate, minimize energy absorption by the substrate and maximize light emitting from the assembly. As used herein, the phrase silver rich coating is intended to mean coatings of silver or silver based materials such as a mixture of silver and glass.

Some commercially available LED's are available that include an internal reflector and a metallic heat transfer element on the bottom of the device. Other commercially available LED's do not include the internal reflector and/or the heat transfer element. In both situations, assemblies of this invention incorporate a metallic section adjacent the base of the LED to abut the metallic heat transfer element and thereby improve heat dissipation or to reflect light from the LED that would otherwise be absorbed by the substrate and thereby increase the amount of light emitting from the assembly. In the alternative, areas of the electrically insulating layer or anodized layer may be masked during their application to expose the bare metal substrate to the LED thereby to improve heat dissipation and/or to improve reflectivity.

The leads from the LED's are connected to the circuit traces by conventional soldering or wire-bonding. This is accomplished by making the circuit traces of a material compatible with soldering or wire-bonding and/or to apply a metallic section to the terminals of the circuit traces which are compatible with soldering or wire-bonding. Soldering and wire-bonding are preferred techniques for securing the LED's to the substrate because they are easily automated, can be done at the same time other components ar soldered or wire-bonded to the substrate and they provides a durable connection of high thermal and electrical conductivity. The result of this invention is an improved LED assembly incorporating an efficient heat dissipating substrate.

It is an object of this invention to provide an improved light emitting assembly.

Another object of this invention is to provide an improved light emitting assembly incorporating a metal substrate having an electrically insulating coating, one or more circuit paths applied to the coating and one or more light emitting elements soldered or wire-bonded to the circuit paths.

A further object of this invention is to provide an improved light emitting assembly in which a current limiting resistor is incorporated into assembly.

Another object of this invention is to provide an improved light emitting assembly in which a plurality of silver patches are applied to an electrically insulated metal substrate and act as reflectors of light emitting from the light emitting elements.

These and other objects of this invention will become more fully apparent as this description proceeds, reference being made to the accompanying drawings and appended claims.

BRIEF DESCRIPTION OF THE DRAWINGS

FIG. 5 is part of a test panel showing a variety of LED configurations of this invention; and FIG. 6 is part of a test panel showing another set of LED configurations of this invention.

DETAILED DESCRIPTION

Figure 1:
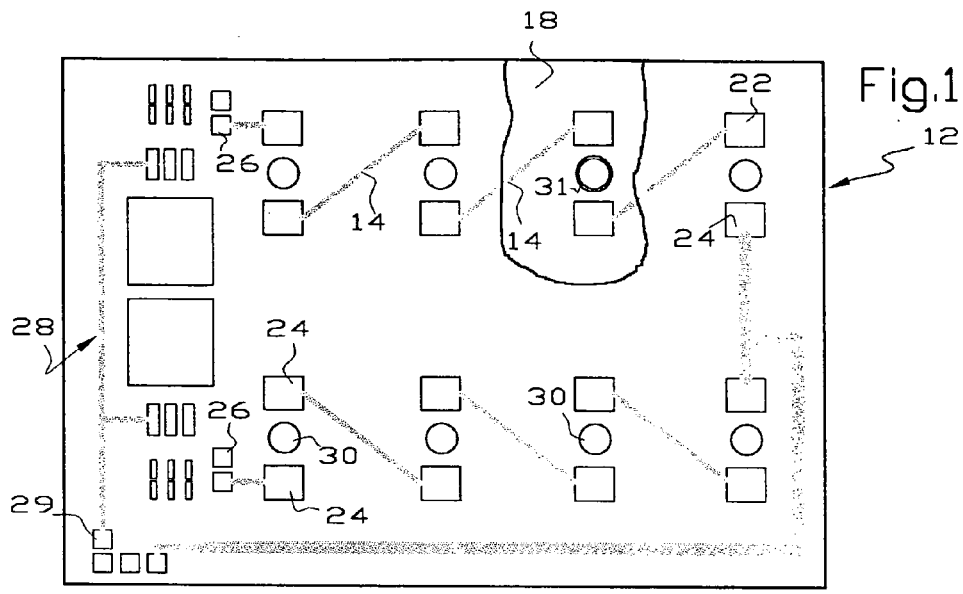
FIG. 1 is a top view of a substrate of a light emitting assembly of this invention.
Figure 2:
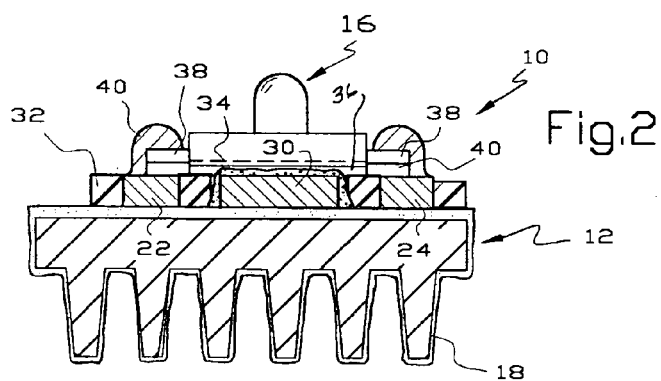
FIG. 2 is an enlarged cross-sectional view of the assembly of FIG. 1, taken substantially along line 2—2 thereof, as viewed in the direction indicated by the arrows showing the substrate with an assembled LED.

Referring to FIGS. 1–2, there is illustrated a light emitting assembly 10 of this invention comprising, as major components, a metal substrate or heat sink 12, a series of circuit traces 14 on the substrate and a series of light emitting elements or LED's 16. The assembly 10 may be used to provide a light source for a variety of applications, such as a vehicle headlight, taillight, brake light, or non-vehicle light source in which a series of LED's are used to deliver light.

The substrate or heat sink 12 may be of any suitable metal that has appropriate heat dissipating characteristics, strength, cost and the ability to receive a thin electrically insulating layer or coating 18. Preferred metals include aluminum, aluminum alloys, magnesium, magnesium alloys, zinc, pot metal and the like. The electrically insulating coating 18 is formed with a thickness of ten microns to one thousand microns, preferably on the order of about fifty to one hundred microns. The electrically insulating coating 18 may be of any suitable type and may be applied in any suitable manner. The coating 18 may be applied by screen printing and then fired in an oven, may be applied in a plasma spraying technique or may be applied as a porcelain enamel. Preferably, however, the coating 18 is an anodized coating, meaning that the metal of the substrate 12 is preferably an anodizable metal such as aluminum, magnesium and their alloys. The optimum material for the substrate is an anodized aluminum alloy because of its combination of high heat dissipating capacity, structural strength and low cost. The substrate 12 includes a flat surface which is necessary or convenient to apply thin or thick film layers and may include heat dissipating fins, corrugations, or other irregular area increasing undulations on a side opposite the flat side to increase the heat rejecting capacity of the substrate 12.

The circuit traces 14 may be either thick or thin film coatings applied by conventional techniques. Low voltage devices are typically made using thick film techniques where an ink is applied by printing techniques to the coating 18. Conventional printing techniques include screen printing, direct writing and the like. After printing, the substrates are passed through an oven to fire the ink, causing the glass component of the thick film ink to melt, to produce adherent electrically conductive circuit traces or paths 14 on the coating 18. Firing the substrate 12 at temperatures above about 400° C. in the process of curing the ink degrades the electrical insulating properties of the anodized layer 18. For this reason, higher voltage devices are made by thin film techniques in which adherent electrically conductive circuit traces are deposited by sputtering, vapor deposition or other suitable thin film techniques that do not require high temperatures. The phrase thin film is known in the art to refer to processes and products where the layers are on the order of 200 to 20,000 Angstroms. The phrase thick film refers to processes and products where the layers are on the order of eight to fifty microns.

The circuit traces 14 extend between various terminals 22, 24, 26 at the ends of the traces 14 to provide the desired circuitry of the assembly 10. In thin film devices, the circuit traces 14 and terminals 22, 24, 26 are preferably silver to provide high conductivity, compatibility with soldering or wire-bonding operations and high reflectivity. In thick film devices, the circuit traces 14, terminals 22, 24, 26 are made by printing a silver based ink onto the anodized layer 18 and then firing the ink. A suitable silver based ink is a silver-glass-carrier mixture available from Metech Polymers of Elverson, Pa. and is known as Type 3270. The circuit traces 14 and the terminals 22, 24, 26 are accordingly preferably of the same material and laid down at the same time during the same process step.

Some of the terminals 26 may be located on the edge of the substrate 12 and may be secured, as by soldering or the like, to connectors (not shown) extending off the side of the assembly 10, at least one of which extends to a power source. In the alternative, the terminals 26 may be connected through circuit traces (not shown) below the traces 14. In the event circuit traces (not shown) are provided below the traces 14, an electrically insulating layer is applied and then cured to provide an electrically insulated base for the traces 14. One or more additional components may be located in an area 28 on the substrate 12 in the event additional functions are required by the assembly 10.

An important feature of this invention is the ability to incorporate a current limiting resistor 29 in the circuit of the assembly 10. The resistor 29 is of the thick or thin film type depending on the selection for the circuit traces 14 and comprises a suitable resistive material such as tantalum nitride. Because the substrate 12 is particularly suited to accommodate high temperatures, the inclusion of the resistor 29, in a small size, presents no thermal problems.

A metallic patch or section 30 is provided beneath or adjacent the LED 16 to transmit heat away from the LED 16 and/or to reflect light from the LED away from the substrate 12. An important feature of this invention is that the circuit traces 14, the terminals 24, 26, 28 and the patches 30 are silver in the case of thin film devices and a silver based material in thick film devices. Making these elements of silver provides compatibility with metal droplet connections, such as soldering or wire bonding, provides good thermal conductivity between the LED and the metal substrate 12 and reflects a significant amount of light emitting from the LEDs thereby maximizing the amount of useable light and minimizing the amount of energy transferred to the substrate.

The patch 30 is preferably made of the same material as the circuit traces 14 and terminals 22, 24, 26 so it may be laid down at the same time and during the same process step as the traces 14 and the terminals 22, 24, 26. To minimize tarnishing of the patches 30, they are preferably coated with a clear or transparent finish, such as lacquer 31. As shown best in FIG. 1, the lacquer 31 conveniently covers only the patch 30 because it is the only component relied upon for reflectivity.

As shown best in FIGS. 1 and 2, a protective coating 32 is applied to the flat surface of the substrate 12 to protect the circuit traces 14. During application of the protective coating 32, the terminals 22, 24, 26 and the patches 30 may be masked off if desired so they are uncovered either because they may subsequently be soldered to or because the protective coating might interfere with their reflectivity. It will be evident that using a clear or transparent protective coating for the entire substrate 12 would obviate the need for a separate clear finish 31.

In the embodiment of FIG. 2, the LED 16 is illustrated as being of the type including an internal reflector 34 and a metallic heat transfer member 36. The heat transfer member 36 is in contact with or juxtaposed to the patch 30 thereby promoting heat transfer away from the LED to the heat sink 12. Leads 38 of the LED 16 are connected to the terminals 22, 24 by solidified droplets 40 of metal as the result of conventional soldering or wire-bonding operations. Because soldering and wire-bonding operations are easily and conventionally automated, it will be seen that all of the connections on the assembly 10 may be made during the same process step rather than in subsequent steps as in the case of some soldering and some thermal adhesive application. It will accordingly be seen that the assembly 10 provides an efficient heat sink for heat produced by the LED because the only thermal impediment between the LED and the metallic substrate 12 is the thin electrically insulating coating 18. Because the coating 18 is thin, i.e. less than 1000 microns and preferably on the order of about 100 microns, not a great deal of thermal transmissivity is lost.

It will be evident that if the LED 16 were of the type that did not have an internal reflector 34, the metal patch 30 acts as a reflector of light emitting from the LED because is shiny and silver.

Figures 3, 4:
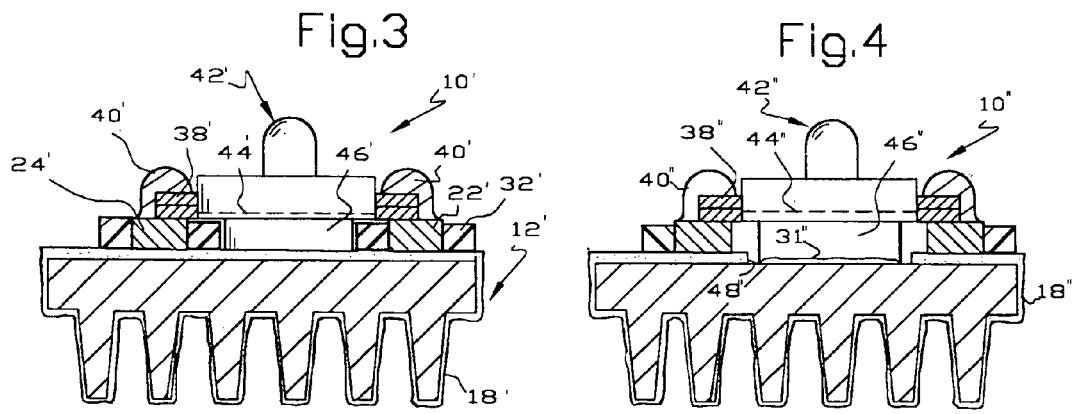
FIG. 3 is an enlarged cross-sectional view, similar to FIG. 2, of another embodiment of this invention.
FIG. 4 is an enlarged cross-sectional view, similar to FIGS. 2 and 3, of another embodiment of this invention.

Referring to FIG. 3, where like components are represented by like reference characters with an apostrophe, there is illustrated a light emitting assembly 10' of this invention comprising, as major components, a metal substrate or heat sink 12' and one or more light emitting elements or LED's 42 which provides an internal reflector 44 but differs from the LED's 16 by the provision of a more pronounced heat transfer member 46. In the embodiment of FIG. 3, the heat transfer member 46 abuts the electrically insulating coating 18' directly, i.e. the metallic patch 30 has been eliminated.

Referring to FIG. 4, where like components are represented by like reference characters with a double apostrophe, there is illustrated a light emitting assembly 10" of this invention comprising, as major components, a metal substrate or heat sink 12" and one or more light emitting elements or LED's 42" which also includes an internal reflector 44" and a pronounced heat transfer member 46". In the embodiment of FIG. 4, the heat transfer member 46" abuts the metal substrate 12" directly because the substrate 12" has been masked off during the application of the electrically insulating coating 18" to provide an opening 48 in the coating 18" so the heat transfer member 42" abuts or juxtaposes the metallic substrate 12" directly so there is no loss of heat transmissivity across the coating 18".

It will be evident that if the LED 42" were of the type that did not have an internal reflector 44", the substrate 12" exposed through the opening 48 provides a suitable reflector, particularly when the substrate 12" is a light colored shiny metal, such as aluminum, magnesium and their alloys. In this event, the substrate 12" may be coated with a clear or transparent finish, such as lacquer 31", to prevent the substrate 12" from tarnishing in an area where reflectivity is important.

Referring to FIG. 5, there is illustrated a test panel 50 illustrating a series of different LED configurations ranging from a single LED assembly on the right to a four LED assembly on the left. The test panel 50 comprises a metal substrate or heat sink 52 having an electrically insulating coating 54 which is preferably an anodized coating. A one-LED assembly 55 includes a pair of silver or silver based circuit traces 56 ending in terminals 58 are applied on the coating 54 in a generally circular pattern. The terminals 58 are typically bonded by soldering or wire-bonding to connectors (not shown) extending off the side of the substrate 52. The circuit traces 56 extend around a central opening 60 over which an LED 62 is placed. The LED 62 includes terminals 64 which are bonded to the circuit trace 56 by metal droplets 66. The circuit traces 56 act to reflect light from the LED 62 and thereby minimize energy absorption by the substrate 52 and maximize light production.

The LED 62 abuts or is otherwise in thermal contact with the electrically insulating coating 54 as allowed by the opening 60 in the circuit trace 56 and is thus in thermal contact with the metal substrate 52. The slits 68 between adjacent circuit traces 56 are sufficient to electrically separate the traces 56 so any electrical current passes through the LED 62. To minimize tarnishing of the circuit traces 56, a clear finish 70 is applied, either by masking off a section where soldering is to be done or, after soldering has been done, over substantially the entire circuit traces 56.

The test panel 50 also includes two four LED assemblies 72, 74 although those skilled in the art will recognize that as many LED's can be incorporated into an array as is desired. The pattern of the slits 76, 78 in the circuit traces 80, 82 is selected, based on the LED's 84, 86 being placed in series. Thus, the slits 76, 78 divide the circuit traces 80, 82 into segments which are electrically connected by the LED's 84, 86 and their leads 88, 90 which are soldered or wire-bonded to the circuit traces 80, 82. The circuit traces 80, 82 provide terminals 92, 94 which connect by conventional arrangements with a power providing circuit. To minimize tarnishing of the circuit traces 80, 82, a clear finish 96, 98 is applied, either by masking off a section where soldering is to be done or, after soldering has been done, over substantially the entire circuit traces 80, 82.

Referring to FIG. 6, there is illustrated a test panel 100 illustrating a series of different LED configurations. The test panel 100 includes a metal substrate 102 exposed through a plurality of windows or openings 104 in an electrically insulating coating 106. A pair of circuit traces 108, 110 are applied to the coating 106 and are separated by a gap 112 of sufficient size to electrically insulate the circuit traces 108, 110. An LED 114 includes terminals 116 bonded to the circuit traces 108, 110 by metal droplets 118. The circuit traces 108, 110 are silver or a silver based material to provide a shiny reflector of light emitting from the LED 114. In addition, the LED 114 abuts or is otherwise in thermal contact with the circuit traces 108, 110 and thereby is in thermal contact with the electrically insulating coating 106 and the metal substrate 102. To minimize tarnishing of the circuit traces 108, 110, a clear finish 120 is applied, either by masking off a section where soldering is to be done or, after soldering has been done, over substantially the entire circuit traces 108, 110.

It will be seen that the gap separating the circuit traces may be varied substantially for a variety of reasons, such as to provide a three terminal device 122. The gap 123 divides the silver layer into sections 124, 126, 128 allowing three leads to be soldered or wire-bonded to the device 122. To minimize tarnishing of the circuit traces 124, 126, 128, a clear finish 130 is applied, either by masking off a section where soldering is to be done or, after soldering has been done, over substantially the entire circuit traces 124, 126, 128.

Other LED configurations or circuit trace configurations may be provided, as shown by the substrate 132 in FIG. 6.

It will be seen that this invention provides a light emitting assembly having an efficient technique for dissipating heat and for reflecting light from the light emitting elements.

Although this invention has been disclosed and described in its preferred forms with a certain degree of particularity, it is understood that the present disclosure of the preferred forms is only by way of example and that numerous changes in the details of construction and operation and in the combination and arrangement of parts may be resorted to without departing from the spirit and scope of the invention as hereinafter claimed.

I claim:

1. A light emitting assembly comprising
a metal substrate providing an inorganic electrically insulating coating less than one thousand microns thickness;
a plurality of circuit traces fired and thereby bonded to the inorganic electrically insulating coating providing terminals and conductive paths for placing light emitting elements in circuit, the terminals being of a composition compatible with metal droplet connections, the circuit traces having therein an inorganic dielectric material and a metal;
a plurality of light emitting elements having leads bonded to the terminals with metal droplets and providing a thermally conductive base having a flat section of predetermined area; and
a solderable thermal conductor, having therein an inorganic dielectric material and a metal, fired and thereby bonded to the inorganic insulating coating, the thermal conductor being spaced from and electrically isolated from the circuit traces, the flat section of the base of at least some of the light emitting elements being in intimate heat exchange relation with the thermal conductor and thereby in conductive heat transmitting relation with the substrate.

2. The light emitting assembly of claim 1 wherein the metal substrate is selected from the group consisting essentially of aluminum, aluminum alloys, magnesium, and magnesium alloys and the electrically insulating coating is an anodized layer.

3. The light emitting assembly of claim 1 wherein the electrically insulating coating is a cured thick film coating.

4. The light emitting assembly of claim 1 wherein the electrically insulating coating is a porcelain enamel.

5. The light emitting assembly of claim 1 wherein the electrically insulating coating is a plasma applied coating.

6. The light emitting assembly of claim 1 wherein the thermal conductor provides a shiny metal section reflecting light from the light emitting element away from the substrate thereby increasing the reflectivity of the assembly and increasing the amount of light emitting from the assembly.

7. The light emitting assembly of claim 1 wherein the circuit traces are thin film traces.

8. The light emitting assembly of claim 1 wherein the circuit traces are thick film traces.

9. The light emitting assembly of claim 1 wherein the metal droplet is a soldered connection.

10. The light emitting assembly of claim 1 wherein the metal droplet is a wirebonded connection.

11. The light emitting assembly of claim 1 further comprising a resistor in thermal contact with the substrate in circuit with the light emitting element.

12. The light emitting assembly of claim 1 wherein the electrically insulating coating is an anodized coating.

13. The light emitting assembly of claim 1 wherein the terminals, circuit traces and thermal conductor lie in a common plane.

14. The light emitting assembly of claim 1 wherein the inorganic dielectric coating provides a flat upper surface, the circuit traces and the thermal conductor being bonded to the flat upper surface and being of the same thickness.

15. The light emitting assembly of claim 1 wherein the inorganic dielectric material of the thermal conductor comprises a glass and the metal of the thermal conductor comprises silver.

16. The light emitting assembly of claim 15 wherein the inorganic dielectric material of the circuit traces comprises a glass and the metal of the circuit traces comprises silver.

17. A light emitting assembly comprising
a metal substrate having a surface providing an inorganic electrically insulating coating less than one thousand microns thickness;
a plurality of circuit traces on the electrically insulating coating providing terminals and conductive paths between the terminals for placing light emitting elements in circuit, the circuit traces comprising a fired inorganic dielectric material and a quantity of silver effective to make the paths conductive, to make the terminals compatible with solder or wirebonded connections and to reflect a significant amount of light away from the substrate; and
at least one light emitting element having leads bonded to the terminals with solder or wirebonded connections and having a flat thermally conductive base, electrically isolated from the circuit traces, the flat base being in intimate heat exchange relation with the dielectric coating and thereby being in conductive heat transmitting relation with the substrate.

18. A light emitting assembly comprising: a metal substrate providing an inorganic electrically insulating coating less than one thousand microns thickness; a plurality of circuit traces on the electrically insulating coating providing terminals and conductive paths for placing light emitting elements in circuit, the terminals being of a composition compatible with metal droplet connection, the circuit traces being a fired inorganic dielectric material and a metal; a solderable thermal conductor having therein a glass and a metal bonded to the insulating coating and thereby in conductive heat transmitting relation with the substrate; and a plurality of light emitting elements having leads bonded to the terminals with metal droplets, the light emitting elements having a thermally conductive base, electrically isolated from the circuit traces, providing a flat section of predetermined area, the flat section being in intimate heat exchange relation with the thermal conductor and thereby being in conductive heat transmitting relation with the substrate.

19. The light emitting assembly of claim 18 wherein the circuit traces comprise silver and glass.

20. The light emitting assembly of claim 18 wherein the metal droplet connection is solder.

21. The light emitting assembly of claim 18 wherein the metal droplet connection is a wire-bonded connection.

22. The light emitting assembly of claim 18 wherein the base is of a predetermined area and all of the predetermined area is in intimate heat exchange relation with the thermal conductor.

23. The light emitting assembly of claim 18 wherein the terminals, circuit traces and thermal conductor lie in a common plane.

24. The light emitting assembly of claim 18 wherein the inorganic dielectric coating provides a flat upper surface, the circuit traces and the thermal conductor being bonded to the flat upper surface and being of the same thickness.

* * * * *